United States Patent [19]

Plus et al.

[11] Patent Number: 4,786,955
[45] Date of Patent: Nov. 22, 1988

[54] SEMICONDUCTOR DEVICE WITH SOURCE AND DRAIN DEPTH EXTENDERS AND A METHOD OF MAKING THE SAME

[75] Inventors: Dora Plus, South Bound Brook; Ronald K. Smeltzer, Princeton Township, Mercer County, both of N.J.

[73] Assignee: General Electric Company, Schenectady, N.Y.

[21] Appl. No.: 18,314

[22] Filed: Feb. 24, 1987

[51] Int. Cl.⁴ .................... H01L 29/78; H01L 27/12; H01L 27/02

[52] U.S. Cl. .................... 357/23.7; 357/23.3; 357/42; 357/4

[58] Field of Search .............. 357/4, 23.7, 23.3, 23.8, 357/42

[56] References Cited

U.S. PATENT DOCUMENTS

| | | |
|---|---|---|
| 4,385,937 | 5/1983 | Ohmura . |
| 4,393,578 | 7/1983 | Cady et al. ............................ 357/91 |
| 4,507,846 | 4/1985 | Ohno ..................................... 29/571 |
| 4,574,467 | 3/1986 | Halfacre et al. ...................... 357/42 |

FOREIGN PATENT DOCUMENTS 56-147480 11/1981 Japan .................................. 357/23.4
61-199665 9/1986 Japan ..................................... 357/4

OTHER PUBLICATIONS

*Appl. Phys. Lett.*, vol. 41, No. 9, Nov. 1, 1981, "Trap-creation . . . Polycrystalline Silicon", by Smelter, pp. 849–851.

Primary Examiner—Martin H. Edlow
Assistant Examiner—Donald J. Featherstone
Attorney, Agent, or Firm—Henry I. Steckler; James C. Davis, Jr.; Paul R. Webb, II

[57] ABSTRACT

A semiconductor device having a layer of semiconductor material disposed on an insulating substrate is disclosed. Source and drain depth extenders are provided within the semiconductor material for extending the respective source and drain regions to the insulating substrate. This device is fabricated in a manner which minimizes damage to the gate oxide layer that often occurs when high energy implants are used to form self-aligned source and drain regions.

8 Claims, 1 Drawing Sheet

SEMICONDUCTOR DEVICE WITH SOURCE AND DRAIN DEPTH EXTENDERS AND A METHOD OF MAKING THE SAME

This invention relates to a semiconductor device which includes a layer of semiconductor material disposed on an insulating substrate and a method of making the same. More particularly, the present invention relates to a MOS/SOI device which includes source and drain depth extenders within the layer of semiconductor material.

BACKGROUND OF THE INVENTION

Semiconductor devices having a layer of semiconductor material disposed on an insulating substrate are generally known in the art. An example of such a device is a silicon-on-insulator (SOI) semiconductor device which includes a silicon island formed on the surface of an insulating material. When the insulating material is a sapphire substrate, the structure is known as a silicon-on-sapphire (SOS) semiconductor device. Metal-oxide-semiconductor (MOS) transistors or other active devices are formed in and on the silicon island. MOS/SOI transistors generally have higher speed and improved radiation hardness in comparison with MOS transistors formed in bulk silicon.

MOS/SOI transistors are conventionally fabricated by first forming an island of semiconductor material, such as single-crystalline silicon, on the surface of an insulating substrate, such as sapphire. The silicon island is generally doped to have a first conductivity type. A gate oxide layer and a gate electrode are then formed on the island. Source and drain regions of a second conductivity type are formed in the silicon island using conventional ion implantation techniques. During the implantation step, the gate electrode acts as a masking layer so that self-aligned source and drain regions are formed in the silicon island. Then, the device is completed using conventional MOS processing techniques.

When fabricating complementary metal-oxide-semiconductor (CMOS) devices in a common island of semiconductor material, it is advantageous to extend the source and drain regions to the insulating substrate so as to avoid a large leakage current between the drain of the P-channel transistor and the source of the N-channel transistor. There can also be leakage between the drain of the N-channel transistor and the source of the P-channel transistor. J. Ohno in U.S. Pat. No. 4,507,846 entitled "Method For Making Complementary MOS Semiconductor Devices," issued Apr. 2, 1985, has addressed this problem by disclosing a method of extending the source and drain regions to the insulating substrate. In this process, a portion of the semiconductor layer between the gate electrodes is removed before the source and drains regions are formed. U.S. Pat. No. 4,507,846 also describes another process for extending the source and drain regions to the insulating substrate by using an additional set of photolithography and ion implantation steps for each MOS transistor.

Even when a single MOS transistor is formed in a single island of semiconductor material, it is desirable to extend the source and drain regions to the insulating substrate. If the source and drain regions do not reach the insulating substrate, the large junction areas form high source and drain capacitance with the body of the channel region. This high source and drain capacitance reduces the speed of the device.

When fabricating MOS/SOI devices, it is desirable to use silicon islands which have a thickness of about 5500 Å or larger so that good quality heteroepitaxial silicon is present in the channel region. However, very high implant energies are needed in the conventional fabrication process to extend the self-aligned source and drain regions to the insulating substrate. When using these implant energies, the dopant ions can pass through the gate electrode, which is acting as a mask, and damage the underlying gate oxide. As discussed in the article by R. K. Smeltzer, entitled "Trap Creation In Channel Oxides Due To Ion Penetration Of Polycrystalline Silicon," *Applied Physics Letter*, 41(9), Nov. 1, 1982, pp. 849–851, the implanted ions produce a large concentration of hole traps in the gate oxide. These traps cause a very large shift in the threshold voltage of the MOS device. Thus, it would be desirable to fabricate MOS/SOI semiconductor devices in a thick island of semiconductor material, e.g. greater than about 5500 Å, with the source and drain regions extending to insulating substrate such that damage to the gate oxide is minimized during the implantation process.

SUMMARY OF THE INVENTION

The semiconductor device of the present invention includes source and drain regions formed in a layer of semiconductor material which is disposed on an insulating substrate. The source and drain regions each have a depth which is less than the thickness of the layer of semiconductor material. Source and drain depth extenders of the same conductivity type as the source and drain regions are formed in the layer of semiconductor material so that they have a common boundary with the insulating substrate. The present invention also includes a method of fabricating the semiconductor device described above.

DETAILED DESCRIPTION OF THE PREFERRED EMBODIMENT

The present invention will be described using single-crystalline silicon as a semiconductor material which is disposed on an insulating substrate of single-crystalline sapphire. However, it should be understood that other conventional semiconductor materials, such as IIb–VIa and IIIa–Va semiconductor compounds, may be substituted for silicon. Additionally, other conventional insulator substrates, such as spinel, beryllium oxide, and silicon dioxide disposed on a semiconductor material, may be substituted for sapphire.

Figure 1:
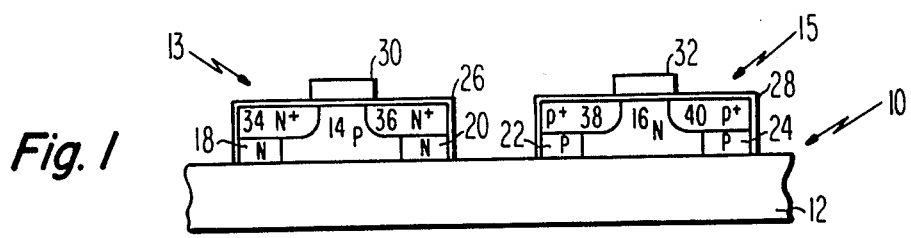
FIG. 1 is a cross-sectional view of a CMOS device of the present invention incorporating source and drain depth extenders. In this device, the P-channel and N-channel transistors are formed in separate islands of semiconductor material.

Referring to FIG. 1, a complementary metal-oxide-semiconductor device incorporating the source and drain depth extenders of the present invention is generally designated as 10. A first silicon island 13 is provided on a sapphire substrate 12 for the N-channel transistor. A second silicon island 15 is also provided on the sapphire substrate 12 for the P-channel transistor.

The N-channel transistor formed in the first silicon island 13 has a P-type region 14 disposed between N-type source and drain depth extenders 18 and 20, respectively. Heavily doped N-type source and drain regions 34 and 36, respectively, are disposed above the respective source and drain depth extenders 18 and 20. The source and drain regions 34 and 36, respectively, each have a depth which is less than the thickness of the first silicon island 13. The source and drain depth extenders 18 and 20, respectively, subtend and contact the respective source and drain regions 34 and 36. The source and drain depth extenders 18 and 20, respectively, have a common boundary with the sapphire substrate 12. FIG. 1 also illustrates that the source and drain depth extenders 18 and 20, respectively, are separated by a distance which is greater than the channel length between the source and drain regions 34 and 36, respectively.

The heavily doped source and drain regions 34 and 36, respectively, have an N-type impurity concentration which is about three orders of magnitude greater than the N-type impurity concentration of the respective source and drain depth extenders 18 and 20. Typically, the source and drain regions 34 and 36, respectively, each have an impurity concentration of about $10^{20}$ cm$^{-3}$ while the source and drain depth extenders 18 and 20, respectively, each have an impurity concentration of about $10^{17}$ cm$^{-3}$. The first silicon island 13 also contains a gate oxide layer 26 and a gate electrode 30.

The second silicon island 15, where the P-channel transistor is located, has an N-type region 16 which separates P-type source and drain depth extenders 22 and 24, respectively. Heavily doped P-type source and drain regions 38 and 40, respectively, are disposed above the respective source and drain depth extenders 22 and 24. The source and drain depth extenders 22 and 24, respectively, each have a common boundary with the sapphire substrate 12. As with the N-channel transistor formed in the first silicon island 13, the source and drain depth extenders 22 and 24, respectively, subtend and contact the respective source and drain regions 38 and 40. The source and drain regions 38 and 40, respectively, each have a depth which is less than the thickness of the second silicon island 15. The channel length between the source and drain regions 38 and 40, respectively, is less than the distance separating the source and drain depth extenders 22 and 24, respectively.

The heavily doped source and drain regions 38 and 40, respectively, have a P-type impurity concentration which is about three orders of magnitude greater than the P-type impurity concentration of the respective source and drain depth extenders 22 and 24. The source and drain regions 38 and 40, respectively, will typically each have an impurity concentration of about $10^{20}$ cm$^{-3}$ while the source and drain depth extenders 18 and 20, respectively, each have an impurity concentration of about $10^{17}$ cm$^{-3}$. A gate oxide layer 28 and a gate electrode 32 are also provided on the second silicon island 15.

Figure 2:
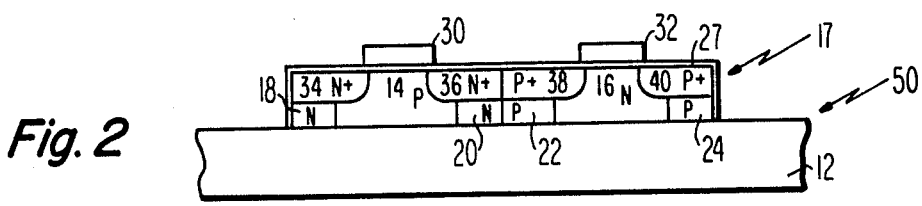
FIG. 2 is a cross-sectional view of an alternative CMOS device of the present invention wherein the N-channel and P-channel transistors are formed in a common island of semiconductor material.

Turning now to FIG. 2, the common island complementary metal-oxide-semiconductor device of the present invention is generally designated as 50. The N-channel and P-channel transistors are formed in a single silicon island 17 which is disposed on a sapphire substrate 12. A gate oxide layer 27 is also disposed on the silicon island 17. The remaining reference numerals which are common to FIGS. 1 and 2 identify like parts.

Figure 3:
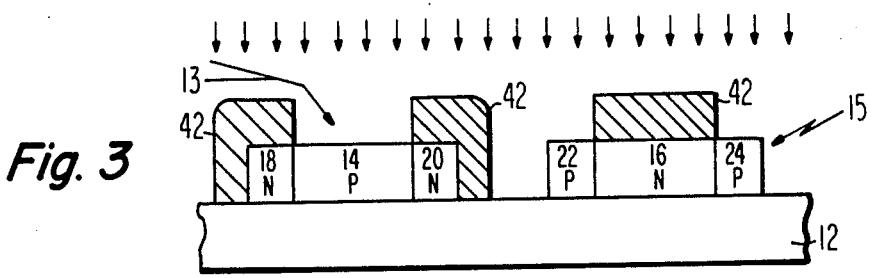
FIGS. 3 to 5 are cross-sectional views illustrating the various steps of the method of the present invention for fabricating a CMOS device with source and drain depth extenders.
Figure 4:
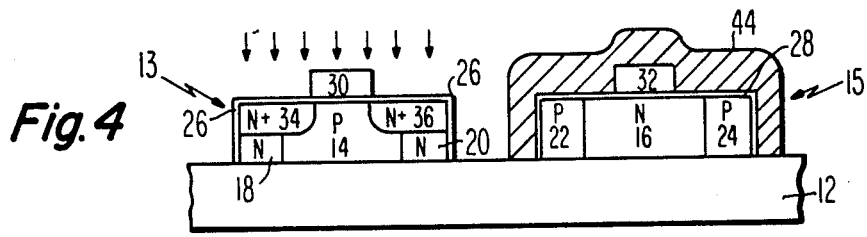
Figure 5:
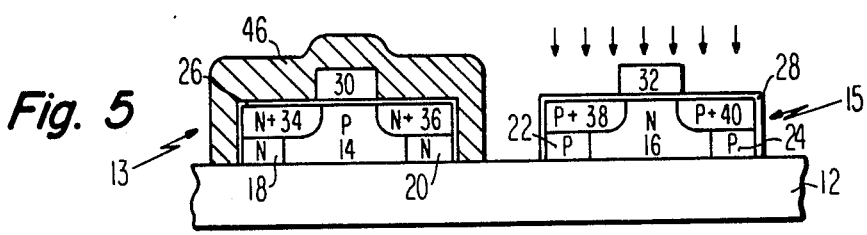

The method for fabricating the semiconductor device shown in FIG. 1 is illustrated by FIGS. 3 to 5. Referring now to FIG. 3, the method begins with a sapphire substrate 12 upon which a continuous layer of N-type single-crystalline silicon, having an impurity concentration of about $10^{17}$ cm$^{-3}$, is grown using conventional heteroepitaxial deposition techniques. A masking layer (not shown), such as a layer of silicon dioxide, is applied and patterned so that the first and second silicon islands 13 and 15, respectively, can be defined through the use of an anisotropic plasma or wet etching technique. The masking layer (not shown) is then removed.

A first photoresist layer 42 is applied and patterned in the manner shown in FIG. 3. The regions of the first silicon island 13 which correspond to the source and drain depth extenders 18 and 20, respectively, are masked. Also, the N-type region 16 of the second silicon island 15 is masked by the first photoresist layer 42. Then, P-type dopants, such as boron, are ion implanted into the respective islands, to form the P-type region 14 in the first silicon island 13 and the source and drain depth extenders 22 and 24, respectively, in the second silicon island 15. The P-type region 14 and the source and drain depth extenders 22 and 24, respectively, each have an impurity concentration of about $10^{17}$ cm$^{-3}$. Then, the first photoresist layer 42 is removed using a conventional solvent.

Referring now to FIG. 4, the gate oxide layers 26 and 28 are formed over the respective silicon islands 13 and 15 by heating the structure in an oxidizing atmosphere to a temperature of about 850° C. An N-type polycrystalline silicon layer (not shown) is formed over the silicon islands 13 and 15 by chemical vapor deposition. Then, the polycrystalline silicon layer is patterned using conventional photolithographic and etching techniques to form the gate electrodes 30 and 32. A second photoresist layer 44 is applied over the entire second silicon island 15. The source and drain regions 34 and 36, respectively, are formed in the first silicon island 13 by ion implanting N-type dopants, such as phosphorus, until an impurity concentration of about $10^{20}$ cm$^{-3}$ is achieved. The implant energies are controlled so that the self-aligned source and drain regions 34 and 36, respectively, each have a depth which is less than the thickness of the first silicon island 13. The source and drain regions have this limited depth because the implant energies are selected so that the dopant ions do not penetrate the gate electrode 30 and damage the underlying portion of the gate oxide layer 26. The second photoresist layer 44 is then removed using a conventional solvent.

As shown in FIG. 5, a third photoresist layer 46 is applied over the entire first silicon island 13. The P-type self-aligned source and drain regions 38 and 40, respectively, are formed in the second silicon island 15 by ion implanting P-type dopants, such as boron, until an impurity concentration of about $10^{20}$ cm$^{-3}$ is achieved. The implant energies used to form the P-type source and drain regions 38 and 40, respectively, are also controlled in the manner described with regard to FIG. 4 so that each of these regions has a depth which is less than the thickness of the second silicon island 15. The third photoresist layer 46 is removed using a solvent. The device is then completed using conventional CMOS processing techniques.

A method similar to that illustrated by FIGS. 3 to 5 is used to form the common island CMOS device 50 shown in FIG. 2. During the implantation step illustrated in FIG. 3, the patterning step used to define the first photoresist layer 42 is modified so that the photoresist layer 42 overlies the regions of the silicon island 17 which correspond to the N-type source and drain depth extenders 18 and 20, respectively, and the N-type region 16. The second 44 and third 46 photoresist layers used in steps illustrated by FIGS. 4 and 5, respectively, are applied so they do not overlie the adjacent MOS transistor.

Although the method illustrated by FIGS. 3 to 5 utilizes N-type single-crystalline silicon as the island material, P-type single-crystalline silicon could also be used. In the latter case, the step illustrated by FIG. 3 would be modified by using N-type dopants with a reverse image of the photoresist pattern shown. The present invention is also considered to include the formation of source and drain depth extenders in a single MOS transistor.

Another embodiment of the present invention would include the use of intrinsic single-crystalline silicon as the island material. The step illustrated by FIG. 3 would be carried out to form the P-type source and drain depth extenders 22 and 24, respectively, and the P-type region 14. The N-type source and drain depth exteneers 18 and 20, respectively, would then be formed by implanting N-type dopants into the first silicon island 13 using a masking layer which is the reverse image of the first photoresist layer 42 shown overlying the first silicon island 13 in FIG. 3. During the latter implantation step, the P-type source and drain dept extenders 22 and 24, respectively, are covered with a masking layer while the central region of the second silicon island 15 is exposed so that the N-type region 16 is formed. However, it may be desirable to mask the entire second silicon island 15 during the N-type implantation step for the source and drain depth extenders 18 and 20, respectively. The mask over the entire second silicon island 15 is removed and a new masking layer is formed over the first silicon island 13. The central region of the second silicon island 15 is then appropriately doped so as to form the channel re gio n for the P-channel transistor. All of the devices produced with the intrinsic single-crystalline island material would then be completed using the steps illustrated in FIGS. 4 and 5.

The damage to the gate oxide layer that occurs when high energy source and drain implants are performed in the conventional method in order to extend the source and drain regions to the insulating substrate is avoided with the method of the present invention. The high energy implant used in the present invention to form the source and drain depth extenders is carried out before the gate oxide layer is grown. Thus, silicon island thicknesses on the order of 5500 Å or larger can be utilized.

The thicker silicon island helps to ensure that good surface mobility will be present in the channel region of the MOS transistor. When the source and drain implants are carried out in the present invention after the gate oxide and gate electrode are formed, only low energy implants are required since the source and drain region have a depth which is less than the silicon island thickness. Ions implanted at these energies will not pass through the gate electrode and damage the gate oxide.

The present invention also extends the source and drain regions of a common island CMOS device to the insulating substrate so that current leakage between adjacent MOS devices is eliminated. In addition to reducing leakage between adjacent devices, the source and drain depth extenders also increase the speed of the CMOS device because there is a lower source/drain capacitance with the body of the channel region. This lower source/drain capacitance is achieved because the junction area between the source and drain regions and the channel is greatly reduced and because the source and drain depth extenders have an impurity concentration of about 3 orders of magnitude less than the respective source and drain regions. The device junction leakage current is also lowered due to the smaller junction area with the channel body. Also, the back-channel length between the source and drain depth extenders is greater than the channel length between the source and drain regions. This longer back-channel provides for a higher series resistance between the source and drain regions. The higher series resistance helps to suppress radiation-induced back-channel leakage in N-channel transistors.

We claim:

1. A semiconductor device, comprising:
an insulating substrate;
a layer of semiconductor material disposed on said insulating substrate;
source and drain depth extenders of a first conductivity type disposed within said layer of semiconductor material so that at least a portion of each of said extenders has a common boundary with said insulating substrate; and
source and drain regions of a first conductivity type disposed within said layer of semiconductor material so that each of said source and drain depth extenders subtend and contact the respective source and drain regions, said source and drain regions each having an impurity concentration which is greater than the impurity concentration of the respective source and drain depth extenders and a depth which is less than the thickness of said layer of semiconductor material.

2. A semiconductor device in accordance with claim 1, further comprising:
a channel region having a defined channel length disposed between said source and drain regions; and
said source and drain depth extenders being separated by a distance greater than said channel length.

3. A semiconductor device in accordance with claim 2 wherein said source and drain regions each having an impurity concentration of at least three orders of magnitude greater than the impurity concentration of the respective source and drain depth extenders.

4. In a complimentary metal-oxide-semiconductor device including an insulating substrate, a layer of semiconductor material disposed on said insulating substrate, a P-channel metal-oxide-semiconductor transistor disposed in a first predetermined portion of said layer and an N-channel metal-oxide-semiconductor transistor disposed in a second predetermined portion of said layer, the improvement comprising:
P-type source and drain depth extenders for said P-channel transistor disposed within said first predetermined portion of said layer so that at least a portion of each of said extenders has a common boundary with said insulating substrate;
N-type source and drain depth extenders for said N-channel transistor disposed within said second predetermined portion of said layer so that at least a portion of each of said extenders has a common boundary with said insulating substrate;

P-type source and drain regions disposed within said first predetermined portion of said layer so that each of said P-type source and drain depth extenders subtend and contact the respective P-type source and drain regions, said P-type source and drain regions each having an impurity concentration which is greater than the impurity concentration of the respective P-type source and drain depth extenders and a depth which is less than the thickness of said layer of semiconductor material; and N-type source and drain regions disposed within said second predetermined portion of said layer so that each of said N-type source and drain depth extenders subtend and contact the respective N-type source and drain regions, said N-type source and drain regions each having an impurity concentration which is greater than the impurity concentration of the respective N-type source and drain depth extenders and a depth which is less than the thickness of said layer of semiconductor material.

5. A complimentary metal-oxide-semiconductor device according to claim 4, further comprising:

channel regions having defined channel lengths disposed between the source and drain regions of each of said N-channel and P-channel transistors; and each of said source and drain depth extenders for said N-channel and P-channel transistors being separated by a distance greater than the channel length of the respective N-channel and P-channel transistors.

6. A complimentary metal-oxide-semiconductor device according to claim 5 wherein said P-type and N-type source and drains each having an impurity concentration of at least three orders of magnitude greater than the impurity concentration of the respective P-type and N-type source and drain depth extenders.

7. A complimentary metal-oxide-semiconductor device according to claim 4 wherein said first and second predetermined portions are disposed in a common island of said layer of semiconductor material.

8. A complimentary metal-oxide-semiconductor device according to claim 4 wherein said first and second predetermined portions are disposed in separate islands of said layer of semiconductor material.

* * * * *